United States Patent
Du

(10) Patent No.: US 10,411,075 B2
(45) Date of Patent: Sep. 10, 2019

(54) PIXEL ARRAY COMPRISING HALF OF REGULAR HEXAGON SHAPED PIXEL, METHOD FOR FABRICATING THE SAME AND OLED ARRAY SUBSTRATE

(71) Applicant: BOE TECHNOLOGY GROUP CO., LTD., Beijing (CN)

(72) Inventor: Xiaobo Du, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 127 days.

(21) Appl. No.: 15/534,727

(22) PCT Filed: Dec. 19, 2016

(86) PCT No.: PCT/CN2016/110728
§ 371 (c)(1),
(2) Date: Jun. 9, 2017

(87) PCT Pub. No.: WO2017/185769
PCT Pub. Date: Nov. 2, 2017

(65) Prior Publication Data
US 2019/0058017 A1 Feb. 21, 2019

(30) Foreign Application Priority Data

Apr. 29, 2016 (CN) .......................... 2016 1 0284035

(51) Int. Cl.
*H01L 27/32* (2006.01)
*H01L 51/00* (2006.01)
*H01L 51/56* (2006.01)

(52) U.S. Cl.
CPC .......... *H01L 27/3218* (2013.01); *H01L 27/32* (2013.01); *H01L 51/0011* (2013.01); *H01L 51/56* (2013.01)

(58) Field of Classification Search
CPC ......... H01L 27/14603; H01L 27/14605; H01L 27/14812; H01L 27/3211; H01L 27/3213;
(Continued)

(56) References Cited

U.S. PATENT DOCUMENTS 7,733,359 B1    6/2010 Hagge
2005/0041188 A1 2/2005 Yamazaki
(Continued)

FOREIGN PATENT DOCUMENTS

CN    1580881 A    2/2005
CN    1725274 A    1/2006
(Continued)

OTHER PUBLICATIONS

Search Report dated Sep. 22, 2016.
(Continued)

*Primary Examiner* — Shaun M Campbell
*Assistant Examiner* — Suberr L Chi
(74) *Attorney, Agent, or Firm* — Dilworth & Barrese, LLP.; Michael J. Musella, Esq.

(57) ABSTRACT

A pixel array, a method for fabricating the same, and an OLED array substrate are disclosed. The pixel array includes a plurality of pixels, wherein each pixel includes four sub-pixels, the four sub-pixels are of the same size and all in a shape of isosceles trapezoid, and the four sub-pixels are arranged into a form of half of a regular hexagon. A display panel having the above structure has a better rotational symmetry, as a result, a high resolution and homogeneity can be achieved for each direction of the display panel.

16 Claims, 6 Drawing Sheets

(58) Field of Classification Search
CPC ............. H01L 27/3216; H01L 27/3218; H01L 27/326; G09G 2300/0439; G09G 2300/0443
See application file for complete search history.

(56) References Cited

U.S. PATENT DOCUMENTS

| | | |
|---|---|---|
| 2006/0033422 A1 | 2/2006 | Chao |
| 2006/0290870 A1 | 12/2006 | Kwak |
| 2009/0001469 A1 | 1/2009 | Yoshida |
| 2011/0102313 A1* | 5/2011 | Hsieh ................. G02F 1/167 345/107 |
| 2016/0284766 A1 | 9/2016 | Wang |
| 2016/0329385 A1* | 11/2016 | Qiu ................. H01L 27/3218 |
| 2016/0351116 A1 | 12/2016 | Sun |
| 2016/0358985 A1 | 12/2016 | Bai et al. |

FOREIGN PATENT DOCUMENTS

| | | |
|---|---|---|
| CN | 101153932 A | 4/2008 |
| CN | 103811533 A | 5/2014 |
| CN | 104009066 A | 8/2014 |
| CN | 104037198 A | 9/2014 |
| CN | 204102903 U | 1/2015 |
| CN | 104362170 A | 2/2015 |
| CN | 104466007 A | 3/2015 |
| CN | 105789261 A | 7/2016 |
| JP | 2009031784 A | 2/2009 |
| TW | 200606769 A | 2/2006 |

OTHER PUBLICATIONS

First Cninese Office Action dated Dec. 2, 2016.
Second Chinese Office Action dated Sep. 15, 2017.
International Search report dated Mar. 17, 2017.

* cited by examiner

US 10,411,075 B2

PIXEL ARRAY COMPRISING HALF OF REGULAR HEXAGON SHAPED PIXEL, METHOD FOR FABRICATING THE SAME AND OLED ARRAY SUBSTRATE

FIELD OF THE ART

The present disclosure relates to the field of display technologies, more particularly, to a pixel array, a method for fabricating the same and an OLED array substrate.

BACKGROUND

A light emitting structure of an Organic Light-Emitting Diode (OLED) device comprises a pair of electrode and an organic light-emitting layer. When a DC voltage is applied, holes are injected into the organic light-emitting layer from an anode, and electrons are injected into the organic light-emitting layer from a cathode. The electrons and holes are combined in the light-emitting layer and release energy, to excite molecules of an organic light-emitting material to form molecules in the excited state. When the molecules in the excited state return to the ground state, photons will be released to emit light.

An OLED display panel is fabricated in many ways, of which an OLED evaporation technology evaporates an organic light-emitting material and forms organic light-emitting devices on locations corresponding to pixels of an array substrate by using a Fine Metal Mask (FMM). Each pixel comprises red, green, and blue (R, G, B) sub-pixels; each sub-pixel has a shape of a quadrilateral, and each sub-pixel has a separate organic light emitting device.

Since an aperture area of the mask has a specified minimum limit, and influence from tolerance has to be considered during the fabrication procedure, enough gaps have to be left between apertures of adjacent pixels, which makes it impossible to improve pixel density significantly. Moreover, sub-pixels of different colors are made with different masks, so it is impossible to increase the arrangement density, the resolution cannot be increased accordingly. In the meantime, the evaporation has a shadow effect, which requires a space between two light-emitting regions, so as to prevent color-mixing. As a result, it is unlikely to make the openings on the mask smaller.

SUMMARY

In first aspect of the disclosure, it is provided a pixel array comprising a plurality of pixels, wherein each of the pixels comprises four sub-pixels; the four sub-pixels are of the same size and all in a shape of an isosceles trapezoid, the four sub-pixels are arranged into a form of half of a regular hexagon.

In second aspect of the disclosure, it is provided an OLED array substrate comprising an organic light emitting layer, wherein the organic light emitting layer has the above-mentioned pixel array.

In third aspect of the disclosure, it is provided a method for fabricating the above-mentioned pixel array.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present disclosure, are not intended to indicate any sequence, amount or importance, but distinguish various components. The terms "comprises," "comprising," "includes," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Figure 1:
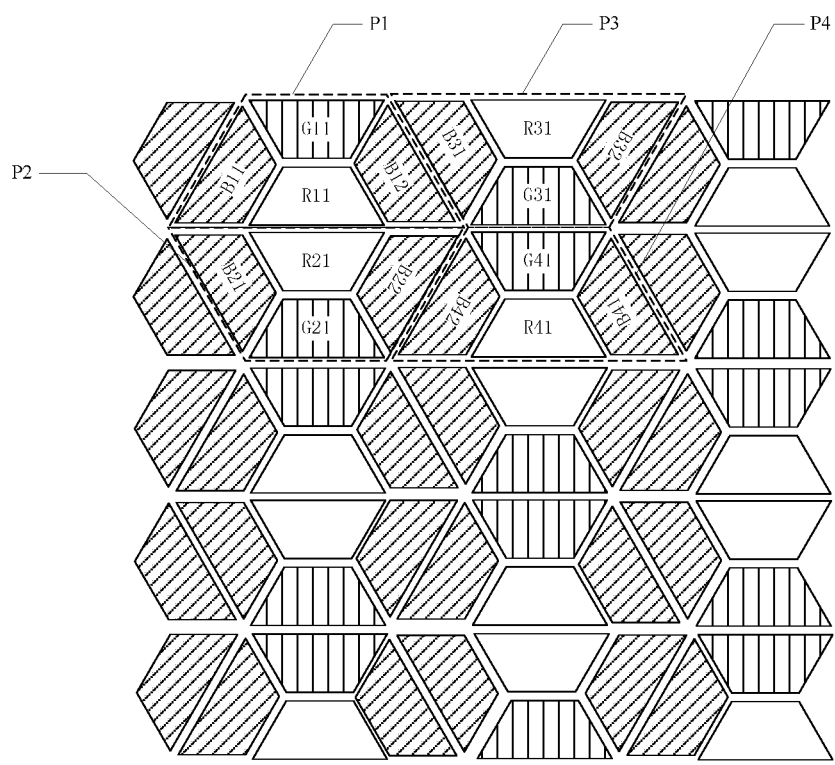
FIG. 1 schematically illustrates a pixel array in accordance with an embodiment of the disclosure.

An embodiment of the disclosure provides a pixel array. As illustrated in FIG. 1, the pixel array comprises a plurality of pixels. For example, it comprises a first pixel P1, a second pixel P2, a third pixel P3, and a fourth pixel P4. Each pixel comprises four sub-pixels. As an example, the first pixel P1 comprises sub-pixels R11 (red), G11 (green), B11 (blue) and B12 (blue); the second pixel P2 comprises sub-pixels R21 (red), G21 (green), B21 (blue) and B22 (blue); the third pixel P3 comprises sub-pixels R31 (red), G31 (green), B31 (blue) and B32 (blue); and the fourth pixel P4 comprises sub-pixels R41 (red), G41 (green), B41 (blue) and B42 (blue). The four sub-pixels are of the same size and all in a shape of an isosceles trapezoid, the four sub-pixels are arranged into a form of half of a regular hexagon. As an example, in the first sub-pixel P1, the four sub-pixels G11, R11, B11 and B12 are of the same size and shape, that is, an isosceles trapezoid. The four sub-pixels G11, R11, B11 and B12 are arranged into the form of half of a regular hexagon. Similarly, the second pixel P2, the third pixel P3 and the fourth pixel P4 all have similar structure to the first pixel p1. It is noted that in practical applications the first pixel P1 formed by the four sub-pixels G11, R11, B11 and B12 is not a strict half regular hexagon, because there are gaps existing at boundaries between adjacent sub-pixels. However, a person skilled in the art will understand that the gaps are ignored herein for simplicity reasons.

In at least some of embodiments of the disclosure, at least three of the four pixels are of different colors. As an example, in the first pixel P1, the sub-pixels R11, G11 and B11 are respectively of red, green and blue colors, and B12 and B11 are of the same color. Because the blue light is of a lower light efficiency, the blue pixel has an aperture area larger than that of a red (or green) pixel. It can be understood that positions of the four sub-pixels G11, R11, B11 and B12 may be adjusted. As an example, the positions of the sub-pixels B11 and G11 are swapped, and the positions of the sub-pixels R11 and B12 are swapped. FIG. 1 only illustrates one arrangement for illustrative purpose; other arrangement manners will not be described in detail herein. In at least some of embodiments of the disclosure, the four sub-pixels are red (R), green (G), blue (B), and white (W) pixels respectively. An arrangement of the sub-pixels in four colors may be the same as or different from that of FIG. 1. As an example, the sub-pixel B11 is replaced with the red sub-pixel, the sub-pixel G11 is replaced with the blue sub-pixel, the sub-pixel R11 is replaced with the white-sub-pixel, and the sub-pixel B12 is replaced with the green sub-pixel.

Figure 2:
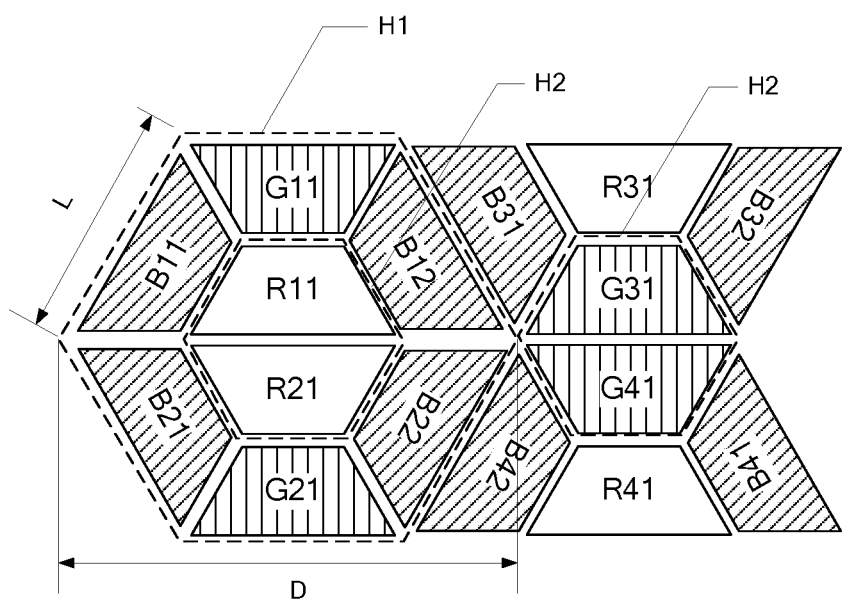
FIG. 2 schematically illustrates a partially enlarged view of the pixel array of FIG. 1.
Figure 3:
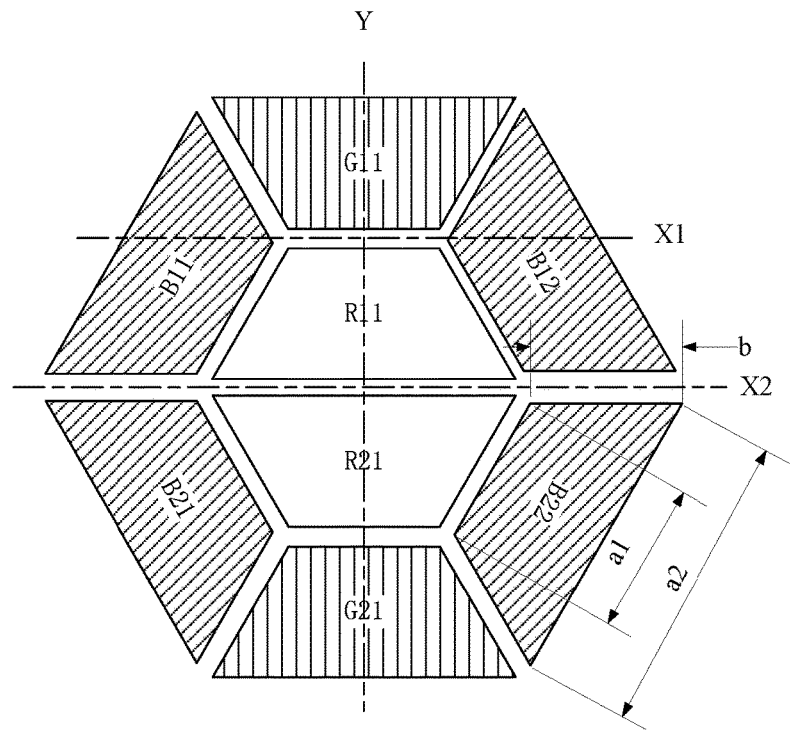
FIG. 3 schematically illustrates two pixels of the pixel array of FIG. 1.

In at least some of embodiments of the disclosure, two adjacent pixels on a same row or two adjacent pixels on a same column form a regular hexagon. In other words, the two pixels have complementary shapes. As illustrated in FIGS. 2 and 3, for example, a first pixel P1 and an adjacent second pixel P2 on the same column forms a regular hexagon H1, and a first pixel P1 and an adjacent third pixel P3 on the same row can also form a regular hexagon H1. That is, the first pixel P1 can overlap with the second pixel P2 or the third pixel P3 after being rotated by 180°. Therefore, a side length of the regular hexagon is substantially equal to a length of a lower base of the isosceles trapezoid of any one of sub-pixels, that is, L=a2. A length of a diagonal of the regular hexagon is substantially equal to a sum of the length of the lower base of the isosceles trapezoid and twice a leg length of the isosceles trapezoid, that is, D=a2+2b.

As illustrated in FIG. 2, six sub-pixels G11, B11, B12, G21, B21, and B22 are next to each other and form a hexagonal loop, with a lower base of each sub-pixel as a side of the hexagon. The rest two sub-pixels R11 and R21 are arranged within the hexagonal loop in a lower base facing lower base manner, that is, the central region of the hexagon forms a smaller hexagon H2. As an example, a leg length of the isosceles trapezoid is equal to a length of its upper base, that is, b=a1.

In at least some of embodiments of the disclosure, each pixel consists of a first sub-pixel, a second sub-pixel, a third sub-pixel and a fourth sub-pixel, wherein the first and second sub-pixels are arranged as being mirror symmetrical with respect to a horizontal central line of the pixel, and the third and fourth sub-pixels are arranged as being mirror symmetrical with respect to a vertical central line of the pixel. As an example illustrated in FIG. 3, in the first pixel P1, the sub-pixel G11 and the sub-pixel R11 are arranged as being mirror symmetrical with respect to a horizontal central line X1 of the pixel P1, and the sub-pixel B11 and the sub-pixel B12 are arranged as being mirror symmetrical with respect to a vertical central line Y of the pixel P1. Moreover, the first pixel P1 and the second pixel P2 next to each other on the same column are arranged as being mirror symmetrical with respect to a horizontal central line X2 of the regular hexagon.

In at least some of embodiments of the disclosure, of two adjacent pixels on the same column, two sub-pixels next to each other along a vertical direction and having a same color form a regular hexagon. For example, as illustrated in FIG. 2, of the first pixel P1 and the second pixel P2 adjacent to each other on the same column, the red sub-pixel R11 of the first pixel P1 and the red sub-pixel R21 of the second pixel P2 are next to each other and form a regular hexagon H2. Similarly, of the third pixel P3 and the fourth pixel P4 adjacent to each other on the same column, the green sub-pixel G31 of the third pixel P3 and a green sub-pixel G41 of the fourth pixel P4 are next to each other and form a regular hexagon H2.

Figure 4:
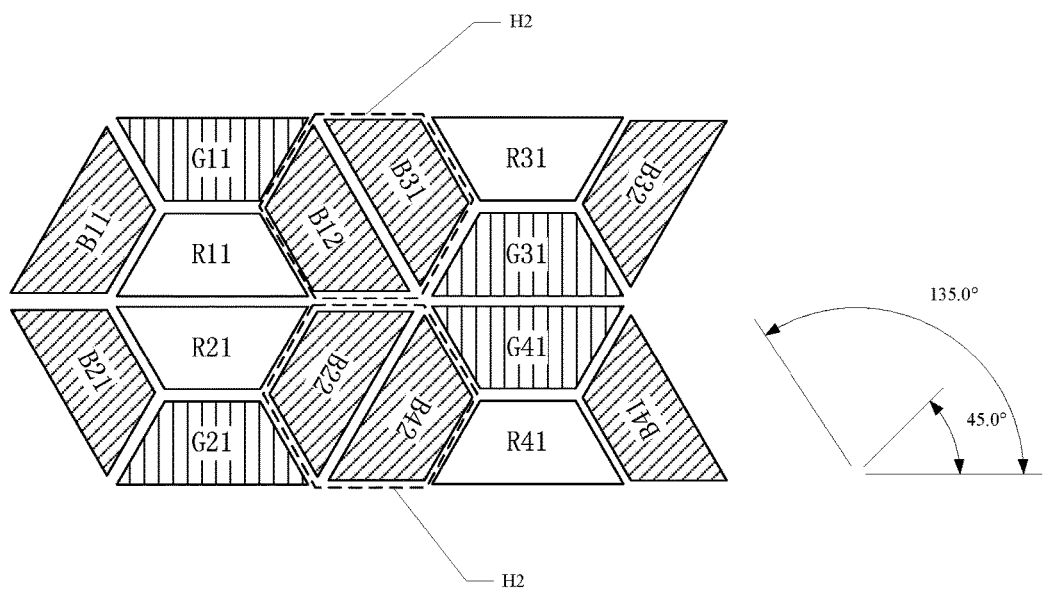
FIG. 4 schematically illustrates a partially enlarged view of the pixel array of FIG. 1.

In at least some of embodiments, of two adjacent pixels on a same row, two sub-pixels next to each other along an oblique direction with an inclination angle of 45° or 135° relative to the horizontal direction and having a same color form a regular hexagon. For example, as illustrated in FIG. 4, of the first pixel P1 and the third pixel P3 adjacent to each other on the same row, the blue sub-pixel B12 and the blue sub-pixel B21 next to each other along an oblique direction with an inclination angle of 45° relative to the horizontal direction form a regular hexagon. Of the second pixel P2 and the fourth pixel P4 adjacent to each other on the same row, the blue sub-pixel B22 and the blue sub-pixel B42 next to each other along an oblique direction with an inclination angle of 135° relative to the horizontal direction form a regular hexagon.

In the pixel array of the above embodiments of the disclosure, a plurality of pixels having the shape of the above half regular hexagon are arranged sequentially along the horizontal and vertical directions, which makes pixels on the whole display panel to have a good rotational symmetry, and each direction of the display panel to have a high resolution and homogeneity.

An embodiment of the disclosure further provides an OLED array substrate, which comprises an organic light-emitting layer, wherein the organic light-emitting layer has the pixel arrays of the above embodiment.

An embodiment of the disclosure further provides a method for fabricating a pixel array, comprising: fabricating sub-pixel patterns of at least three different colors by using a same mask.

Figure 5:
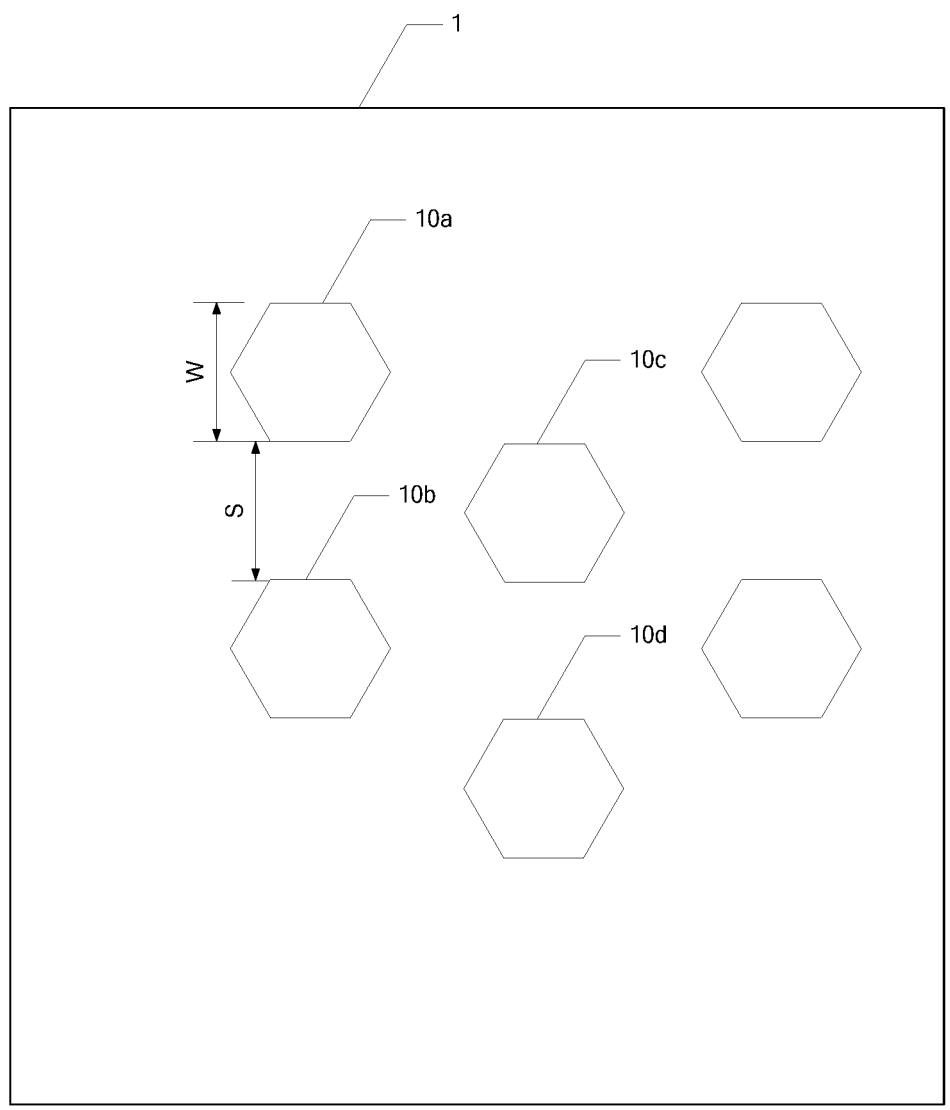
FIG. 5 schematically illustrates a mask in accordance with an embodiment of the disclosure.

In at least some of embodiments of the disclosure, the mask comprises a plurality of apertures arranged as an array, the plurality of apertures are equal in size and all in a shape of the regular hexagon. For example, as illustrated in FIG. 5, a mask 1 comprises a plurality of apertures 10a, 10b, 10c, 10d, all with the same size and having a shape of a regular hexagon. The mask may be made of a metal material. In at least some of embodiments, a distance between any two adjacent apertures, such as apertures 10a and 10b, on the same column is S, the distance S is a vertical distance from a lower base of the aperture 10a to an upper base of the aperture 10b. As an example, the distance S is equal to a width W of the regular hexagon. The width W is a vertical distance from the top side to the bottom side of the aperture. In at least some of embodiments, apertures in two adjacent columns are staggered relative to another. For example, the apertures 10a and 10b on the left column are staggered relative to the apertures 10c and 10d on the right column of FIG. 5.

Figure 6:
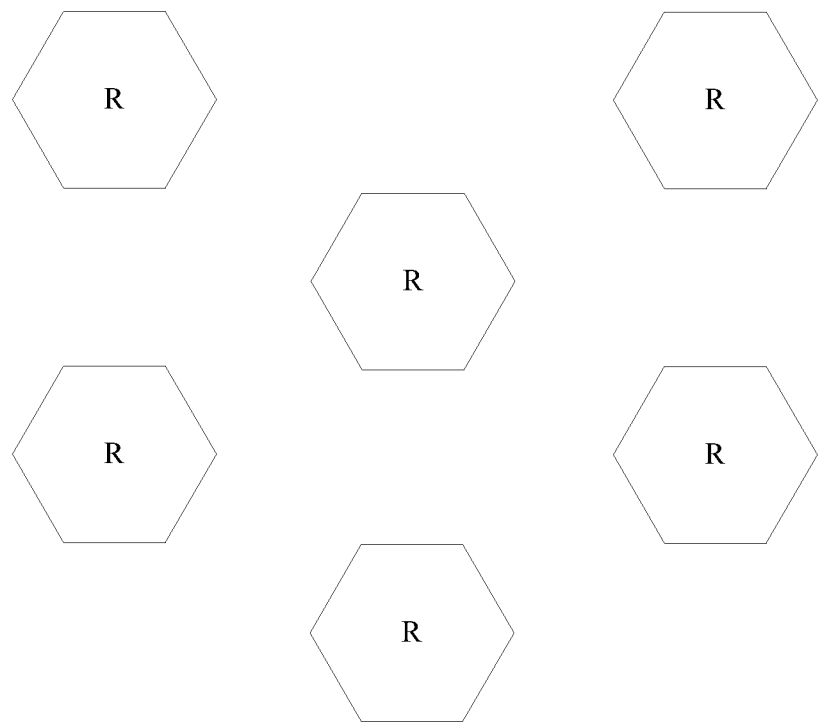
FIG. 6 schematically illustrates a red sub-pixel pattern in accordance with an embodiment of the disclosure.
Figure 10:
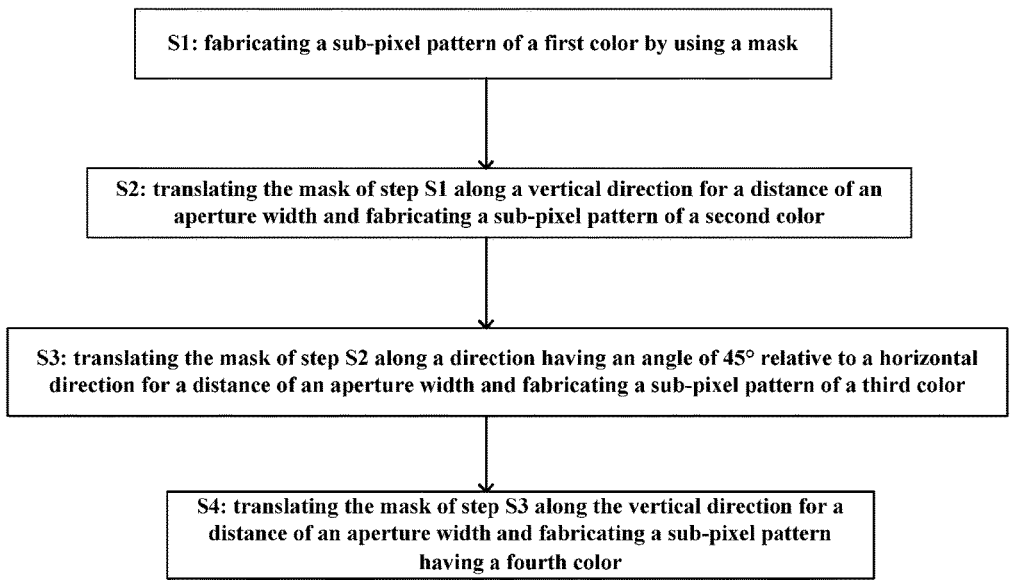
FIG. 10 schematically illustrates a flow chart of a method for fabricating a pixel array in accordance with an embodiment of the disclosure.

As illustrated in FIG. 10, in at least some of embodiments of the disclosure, the above fabrication method comprises:

S1: fabricating a sub-pixel pattern of a first color by using a mask;

As an example, the mask of FIG. 5 is used to fabricate the red sub-pixel patterns of FIG. 1 on the substrate, such as R11, R21, R31, R41 . . . . For example, the mask 1 is placed above the substrate, then a red color film material is evaporated, the evaporated red color film material is deposited onto the substrate through the plurality of apertures on the mask 1, thereby forming the red sub-pixel pattern of FIG. 6. The red sub-pixel pattern comprises a plurality of red regular hexagons, wherein the red sub-pixels R11 and R21 of FIG. 1 are formed through one aperture, and the red sub-pixel R41 and a red sub-pixel below R4a are formed through one aperture. Other sub-pixels are formed in a similar way.

Figure 7:
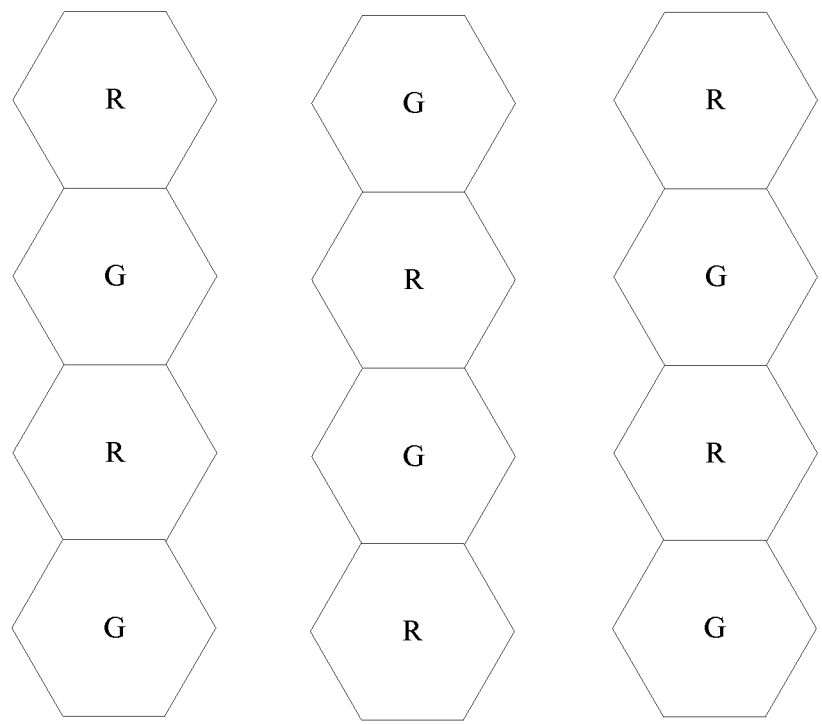
FIG. 7 schematically illustrates a green sub-pixel pattern in accordance with an embodiment of the disclosure.

S2: translating the mask of step S1 along a vertical direction for a distance of an aperture width and fabricating a sub-pixel pattern of a second color;

As an example, the mask 1 is again used to fabricate the green sub-pixel patterns of FIG. 1 on the substrate, such as G11, G21, G31, G41 . . . . As an example, after step S1 is finished, the mask 1 is translated downwards by a distance W along the vertical direction, then a green color film material is evaporated, the evaporated green color film material is deposited onto the substrate through the plurality of apertures, thereby forming the green sub-pixel pattern of FIG. 7. The green sub-pixel pattern comprises a plurality of green regular hexagons, wherein the sub-pixel G21 of FIG. 1 and a green sub-pixel above G21 are formed through one aperture, the sub-pixel G21 and a green sub-pixel below are formed through one aperture, and the sub-pixels G31 and G41 are formed through one aperture. Other green sub-pixels are formed in a similar way. The green sub-pixel pattern and the red sub-pixel pattern are staggered relative to another.

Figure 8:
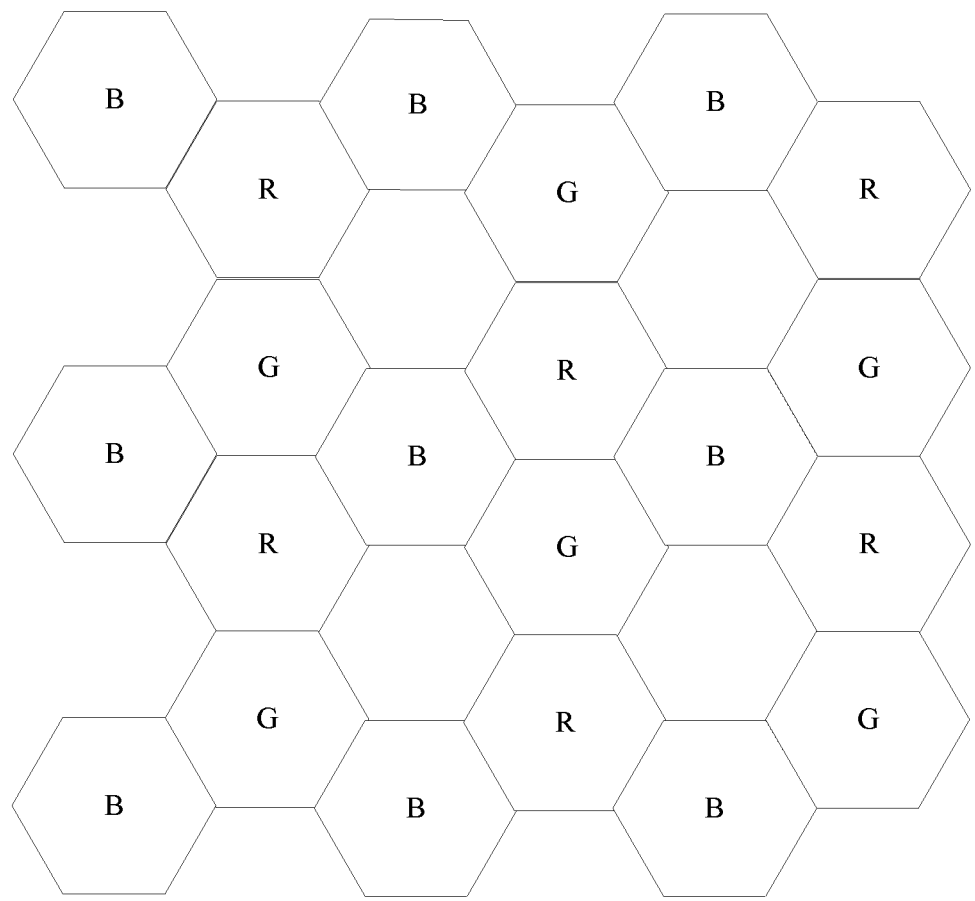
FIGS. 8 and 9 schematically illustrate blue sub-pixel patterns in accordance with an embodiment of the disclosure.

S3: translating the mask of step S2 along a direction having an angle of 45° relative to a horizontal direction for a distance of an aperture width and fabricating a sub-pixel pattern of a third color;

As an example, the mask 1 is again used to fabricate the blue sub-pixel patterns of FIG. 1 on the substrate, such as B11, B12, B31, B32 . . . . As an example, after step S2 is finished, the mask 1 is translated along the direction having an angle of 45° relative to the horizontal direction by a distance W, then a blue color film material is evaporated, the evaporated blue color film material is deposited onto the substrate through the plurality of apertures, thereby forming the blue sub-pixel pattern of FIG. 8. The blue sub-pixel pattern comprises a plurality of blue regular hexagons, wherein the sub-pixel B11 of FIG. 1 and a blue sub-pixel to its left are formed through one aperture, the sub-pixels B12 and B31 are formed through one aperture, and the sub-pixel B32 and a blue sub-pixel to its right are formed through one aperture.

S4: translating the mask of step S3 along the vertical direction for a distance of an aperture width and fabricating a sub-pixel pattern having a fourth color.

Figure 9:
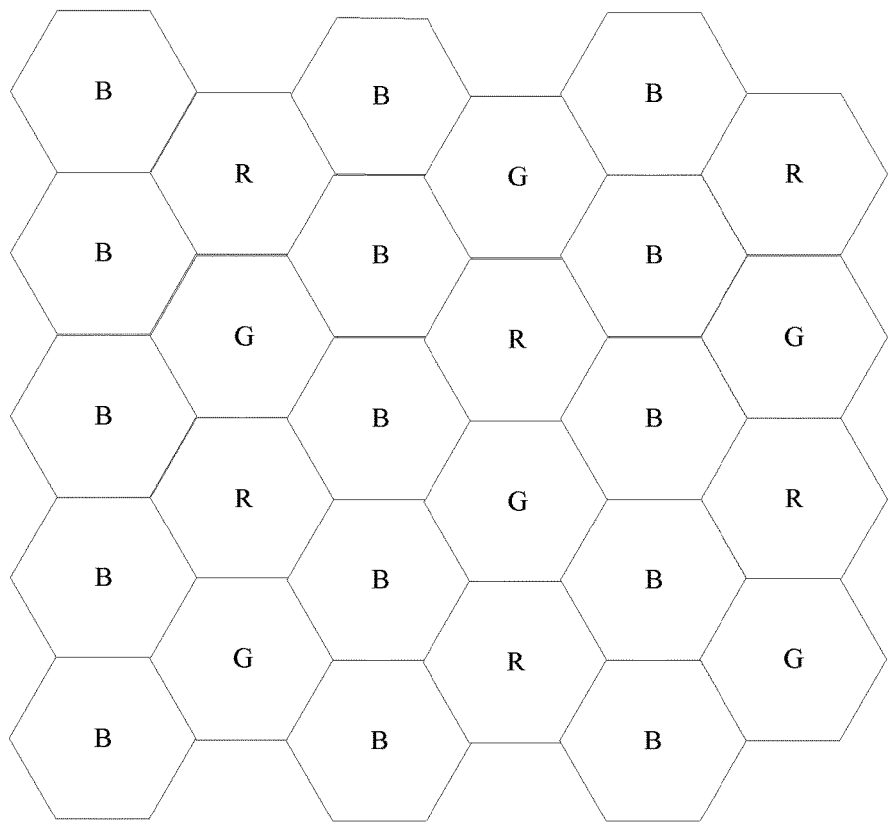

The fourth color may be the same as or different from the third color. As an example, the mask 1 is again used to fabricate the blue sub-pixel patterns of FIG. 1 on the substrate, such as B21, B22, B42, B41 . . . . As an example, after step S3 is finished, the mask 1 is translated upwards by W along the vertical direction, then a blue color film material is evaporated, the evaporated blue color film material is deposited onto the substrate through the plurality of apertures, thereby forming the blue sub-pixel pattern of FIG. 9, wherein the sub-pixel B21 of FIG. 1 and a blue sub-pixel to its left are formed through one aperture, the sub-pixels B22 and 42 are formed through one aperture, and the sub-pixel B42 and a blue sub-pixel to its right are formed through one aperture. Eventually, the blue sub-pixel pattern, the green sub-pixel pattern and the red sub-pixel pattern are formed on the substrate in a non-overlapping fashion.

Since sub-pixels of adjacent pixels shares one aperture of the mask, the aperture area of the mask can be increased, thereby increasing the resolution of the display. Moreover, because sub-pixels of different colors are of the same size, they are fabricated using the same mask, which reduces the difficulty in fabricating the mask and evaporation. The stable structure of regular hexagons can further increase the strength of the mask, making it difficult to deform, and increasing yield rate. Moreover, because the pixels have a high rotational symmetry, a high resolution may be achieved on each direction of the display.

What is described above is related to the illustrative embodiments of the disclosure only and not limitative to the scope of the disclosure; the scopes of the disclosure are defined by the accompanying claims.

The present application claims priority from Chinese Application No. 201610284035.1, filed on Apr. 29, 2016, the disclosure of which is incorporated herein by reference in its entirety.

What is claimed is:

1. A pixel array comprising a plurality of pixels, wherein each of the pixels consists of four sub-pixels, the four sub-pixels are of the same size and all in a shape of an isosceles trapezoid, each pixel is in a form of half of a regular hexagon.

2. The pixel array of claim 1, wherein at least three of the four pixels are of different colors.

3. The pixel array of claim 2, wherein a side length of the regular hexagon is equal to a length of a lower base of the isosceles trapezoid.

4. The pixel array of claim 3, wherein each of the pixels consists of a first sub-pixel, a second sub-pixel, a third sub-pixel and a fourth sub-pixel, wherein the first and second sub-pixels are arranged as being mirror symmetrical with respect to a horizontal central line of the pixel, and the third and fourth sub-pixels are arranged as being minor symmetrical with respect to a vertical central line of the pixel.

5. The pixel array of claim 4, wherein colors of the first pixel, the second pixel and the third pixel are different from one another, and the third and four pixels are of a same color.

6. The pixel array of claim 4, wherein colors of the first pixel, the second pixel, the third pixel and the fourth pixel are all different from one another.

7. The pixel array of claim 3, wherein in two adjacent pixels on a same column, two sub-pixels next to each other along a vertical direction and having a same color form a regular hexagon.

8. The pixel array of claim 3, in two adjacent pixels on a same row, two sub-pixels next to each other along an oblique direction of 45° or 135° and having a same color form a regular hexagon.

9. An OLED array substrate comprising an organic light emitting layer, wherein the organic light emitting layer comprises the pixel array of claim 1.

10. A method for fabricating the pixel array of claim 1, comprising:
fabricating four sub-pixel patterns by using a same mask, at least three of the four sub-pixel patterns are of different colors.

11. The method of claim 10, comprising:
fabricating a sub-pixel pattern having a first color by using the mask;
translating the mask along a vertical direction for a distance of an aperture width and fabricating a sub-pixel pattern having a second color;
translating the mask along a direction having an angle of 45° relative to a horizontal direction for a distance of an aperture width and fabricating a sub-pixel pattern having a third color;
translating the mask along the vertical direction for a distance of an aperture width and fabricating a sub-pixel pattern having a fourth color.

12. The method of claim 10, wherein the mask comprises a plurality of apertures arranged as an array, the plurality of apertures are equal in size and all in a shape of the regular hexagon.

13. The method of claim 12, wherein the apertures on the same column are arranged with equal intervals, and the interval is a width of the regular hexagon.

14. The method of claim 12, wherein apertures in two adjacent columns are staggered relative to each other.

15. The method of claim 12, wherein the third color and the fourth color are the same.

16. A pixel array comprising a plurality of pixels, wherein each of the pixels comprises four sub-pixels, the four sub-pixels are of the same size and all in a shape of an isosceles trapezoid, the four sub-pixels are arranged into a form of half of a regular hexagon, and a side length of the regular hexagon is equal to a length of a lower base of the isosceles trapezoid.

* * * * *